United States Patent
Ikuta

(10) Patent No.: US 9,046,807 B2
(45) Date of Patent: Jun. 2, 2015

(54) SURFACE EMITTING LASER

(75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 139 days.

(21) Appl. No.: 13/311,310

(22) Filed: Dec. 5, 2011

(65) Prior Publication Data

US 2012/0147918 A1  Jun. 14, 2012

(30) Foreign Application Priority Data

Dec. 10, 2010 (JP) ................. 2010-276170

(51) Int. Cl.
*H01S 5/00* (2006.01)
*G03G 15/04* (2006.01)
*H01S 5/183* (2006.01)

(52) U.S. Cl.
CPC ...... *G03G 15/04072* (2013.01); *H01S 5/18391* (2013.01); *H01S 5/18313* (2013.01); *H01S 2301/18* (2013.01)

(58) Field of Classification Search
USPC ............................ 372/50.11, 50.124, 99, 108
See application file for complete search history.

(56) References Cited

U.S. PATENT DOCUMENTS

| 5,388,120 A | 2/1995 | Ackley et al. |
|---|---|---|
| 6,727,520 B2 | 4/2004 | Morgan et al. |
| 2008/0069168 A1 | 3/2008 | Kim et al. |
| 2010/0027578 A1* | 2/2010 | Takeuchi ................. 372/50.124 |

FOREIGN PATENT DOCUMENTS

| CN | 1964145 A | 5/2007 |
|---|---|---|
| CN | 101685941 A | 3/2010 |
| JP | H02-100391 A | 4/1990 |
| JP | 2001-284722 A | 10/2001 |
| JP | 2003-115634 A | 4/2003 |
| JP | 2003-347671 A | 12/2003 |
| JP | 2006-019470 A | 1/2006 |
| JP | 2006-210429 A | 8/2006 |
| JP | 2007-201398 A | 8/2007 |
| JP | 2010-040600 A | 2/2010 |
| JP | 2010-062267 A | 3/2010 |
| JP | 2010-251342 A | 11/2010 |

* cited by examiner

*Primary Examiner* — Yuanda Zhang
(74) *Attorney, Agent, or Firm* — Canon USA Inc. IP Division

(57) ABSTRACT

A surface emitting laser includes a stepped structure including portions having different thicknesses. The optical path length from a plane defined above the stepped structure and extending parallel to a base substrate to an interface between a front mirror and the stepped structure is set to a specific value in each of the portions of the stepped structure.

14 Claims, 8 Drawing Sheets

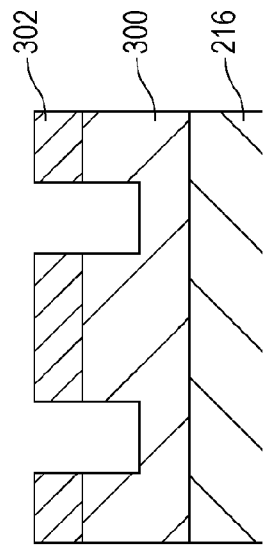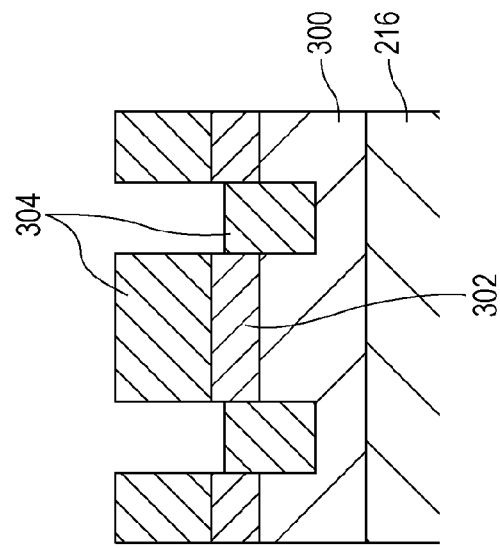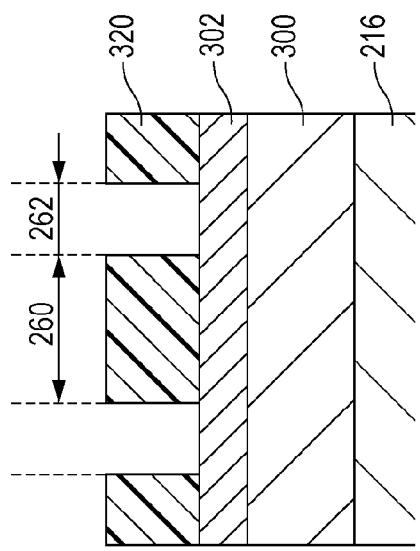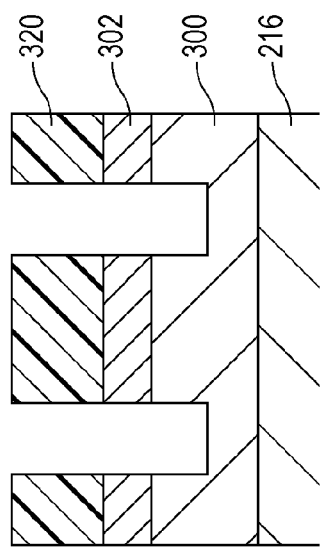

SURFACE EMITTING LASER

BACKGROUND OF THE INVENTION

1. Field of the Invention

The present invention relates to a surface emitting laser.

2. Description of the Related Art

Vertical-cavity surface emitting lasers (VCSEL) are used as light sources of exposure optical systems included in electrophotographic image forming apparatuses.

A surface emitting laser used as a light source of an image forming apparatus is desired to oscillate in a single transverse mode.

Japanese Patent Laid-Open No. 2001-284722 discloses a technique of causing a surface emitting laser to oscillate in a single transverse mode by providing a relief structure, i.e., a stepped structure, on the output surface of the surface emitting laser.

That is, the stepped structure is configured such that the reflectance of a portion thereof extending in central part of an emission area is higher than the reflectance of a portion thereof extending in outer part of the emission area. In the fundamental transverse mode, the distribution of light intensity is concentrated in the central part, compared with distributions of light intensity in higher-order transverse modes. Furthermore, the presence of the stepped structure increases the reflectance in the central part. Therefore, light oscillation in the fundamental transverse mode can be selectively caused. Thus, a single-transverse-mode surface emitting laser is provided.

Such a surface emitting laser may include an oxidized confinement structure that defines the emission area of an active layer. The oxidized confinement structure is obtained by oxidizing a semiconductor layer from the sidewall of a mesa structure including the semiconductor layer toward the center of the structure. The oxidized confinement structure has a lower refractive index in an oxidized and thus insulating region (outer region) thereof than in a semiconductor region (central region) thereof, thereby forming a refractive-index guiding structure. Consequently, the oxidized confinement structure determines the profile of the resonance mode.

In general, the fundamental transverse mode of a cavity of a surface emitting laser forms a function curve representing a symmetrical intensity distribution. The intensity distribution in the fundamental transverse mode substantially conforms to the light intensity distribution in the near field. The light intensity distribution in the near field, i.e., the near field pattern (NFP), is a function curve representing a symmetrical intensity distribution. The phase distribution (wavefront) of light in the near field is even, forming a plane perpendicular to the direction of resonance.

The light distribution (electric-field complex amplitude) in the far field is obtained by Fourier transformation of the light distribution (electric-field complex amplitude) in the near field. If the light intensity distribution is symmetrical and the phase distribution is even in the near field, the phase distribution in the far field is even. The near field pattern (NFP) refers to an electric-field intensity distribution in the near field (a plane immediately after the light output surface). A far field pattern (FFP) refers to an electric-field intensity distribution in a spherical plane centered on the light source with a radius ∞.

In the surface emitting laser including a stepped structure disclosed by Japanese Patent Laid-Open No. 2001-284722, the stepped structure has different optical path lengths in the central part and the outer part. Accordingly, the near-field wavefront is modulated by the stepped structure, making the far-field phase distribution not even. Consequently, the far-field wavefront is shifted from the reference spherical surface centered on the light source, resulting in wavefront aberration.

Particularly, when a surface emitting laser is employed as a light source of an image forming apparatus, the wavefront in the entrance pupil of the exposure optical system included in the image forming apparatus is desired to conform to the reference spherical surface. If the wavefront in the entrance pupil does not conform to the reference spherical surface, the imaging position is shifted from the conjugate point, with respect to the light source, in the image plane at the time of focusing or defocusing.

SUMMARY OF THE INVENTION

The present invention provides a surface emitting laser including a stepped structure configured to produce a reflectance distribution and thus control the transverse mode with reduced wavefront aberration in the far field.

According to an aspect of the present invention, a surface emitting laser configured to oscillate at a wavelength $\lambda$ includes a base substrate; a multilayer structure provided on the base substrate and including a rear mirror, an active layer, and a front mirror; and a first stepped structure provided on the front mirror and including a portion extending in a first area defined in central part of an emission area and a portion extending in a second area defined on an outer side of the first area within the emission area, the portions having different thicknesses. The first stepped structure includes a first structure made of a first material having a refractive index $n_1$ that is larger than a refractive index $n_0$ of an environmental medium. Letting actual thicknesses of the first structure in the first area and the second area be $d_{11}$ and $d_{12}$, respectively, the following holds:

$$|n_1(d_{11}-d_{12})|=\lambda/4\times(2M-1)$$

where M is an integer. In terms of an optical path length from a plane defined above the first stepped structure and extending parallel to the base substrate to an interface between the front mirror and the first stepped structure, an optical path length $L_1$ in the first area and an optical path length $L_2$ in the second area satisfy the following expression with respect to an integer N that minimizes $|L_2-L_1-N\lambda|$:

$$|L_2-L_1-N\lambda|<(\lambda/4)\times(1-n_0/n_1).$$

According to the above aspect of the present invention, the surface emitting laser including the stepped structure produces a reflectance distribution and thus controls the transverse mode, whereby the wavefront aberration in the far field is reduced.

Further features of the present invention will become apparent from the following description of exemplary embodiments with reference to the attached drawings.

BRIEF DESCRIPTION OF THE DRAWINGS

FIGS. 9A to 9D illustrate a method of manufacturing a surface emitting laser described in the third embodiment.

DESCRIPTION OF THE EMBODIMENTS

According to scalar diffraction theory, the resonance mode distribution of a surface emitting laser multiplied by the complex transmission-coefficient distribution produced by a combination of a front mirror and a stepped structure included in the surface emitting laser is regarded as an approximate electric-field complex amplitude in the near field, from which the electric-field complex amplitude in the far field can be obtained. In a central area of a beam, a far field pattern (FFP) calculated from the above approximation and a FFP based on an experiment conform to each other well.

In an exposure optical system of an image forming apparatus, the central area of the beam, in which the intensity of the beam is high, is selectively used with the aid of a stop. Therefore, in a surface emitting laser intended for an exposure optical system of an image forming apparatus, the above approximation may be employed.

In a stepped structure in which the difference in optical path length between different portions thereof is an integral multiple of L, a coefficient ratio with an argument of $2\pi L/\lambda$ is given to the complex transmission-coefficient distribution within the range of the above approximation. Hence, by setting the difference in optical path length in the stepped structure to $N\lambda$ (where N is an integer) or a value close thereto, the phase of the complex transmission-coefficient distribution provided to the near-field light distribution by the stepped structure becomes constant, whereby the far-field wavefront aberration is reduced.

First Embodiment

Figure 1:
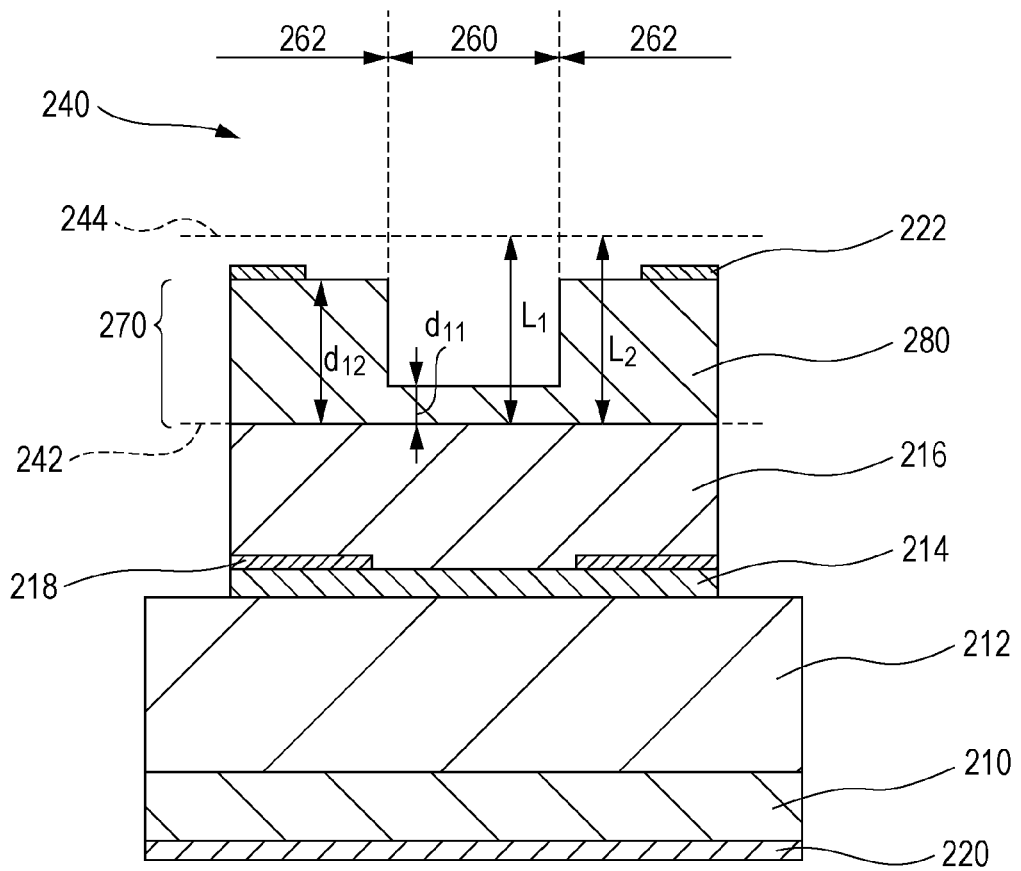
FIG. 1 is a schematic diagram of a surface emitting laser including a concave stepped structure described in a first embodiment of the present invention.

FIG. 1 is a schematic sectional view of a surface emitting laser 200 according to a first embodiment of the present invention.

The surface emitting laser 200 includes a base substrate 210 and a multilayer structure provided on the base substrate 210. The multilayer structure includes a rear mirror 212, an active layer 214, and a front mirror 216.

The base substrate 210 is made of, for example, n-doped GaAs.

The rear mirror 212 is a multilayer mirror including, for example, 70 pairs of n-$Al_{0.5}Ga_{0.5}As$ and n-$Al_{0.9}Ga_{0.1}As$ films that each have an optical thickness of $\lambda/4$. The active layer 214 is a multiple-quantum-well structure made of, for example, GaInP and AlGaInP films. When a current is supplied to the active layer 214, the active layer 214 produces an optical gain in the form of laser oscillation at a wavelength $\lambda$ of 680 nm.

The front mirror 216 includes, for example, 35 pairs of p-$Al_{0.5}Ga_{0.5}As$ and p-$Al_{0.9}Ga_{0.1}As$ films that each have an optical thickness of $\lambda/4$. The active layer 214 and the front mirror 216 are etched into, for example, a cylindrical mesa structure having a diameter of 30 µm.

The front mirror 216 includes, for example, a 30-nm $Al_{0.98}Ga_{0.02}As$ layer. Part of the layer is oxidized from the sidewall of the mesa structure, thereby forming an oxidized region. The oxidized region functions as an insulator and has a lower refractive index than a non-oxidized region.

The oxidized region and the non-oxidized region in combination form a current confinement structure 218 that limits the spatial distribution of the current flowing through the active layer 214. The non-oxidized region has, for example, a circular shape with a diameter of 5 µm.

The front mirror 216 carries thereon a stepped structure 270 having different optical thicknesses in different planar areas. Herein, the interface between the front mirror 216 and the stepped structure 270 is denoted by reference numeral 242.

The stepped structure 270 (a first stepped structure) includes a first structure 280.

The first structure 280 is made of a first material having a refractive index $n_1$. For example, the first material is p-AlGaAs and has a refractive index $n_1$ of 3.3. An environmental medium 240 is air and has a refractive index $n_0$ of 1, which is smaller than $n_1$.

A rear electrode 220 made of, for example, AuGe and Au films underlies the base substrate 210. A front electrode 222 made of Ti, Pt, and Au films, for example, overlies the first structure 280.

The first structure 280 has an actual thickness $d_{11}$ in a first area 260 defined in central part of an emission area, and an actual thickness $d_{12}$ in a second area 262 defined on the outer side of the first area 260.

The first area 260 is a circular area whose center substantially coincides with the center of the non-oxidized region of the current confinement structure 218. For example, when the surface emitting laser 200 is seen from above, the first area 260 forms a circular area with a diameter of 4 µm on the inner side of the non-oxidized region.

The second area 262 is an area surrounding the first area 260.

In the first embodiment, the first structure 280 has a concave sectional shape with $d_{11}$ being smaller than $d_{12}$.

The first structure 280 has an optical thickness that is an even multiple of $\lambda/4$ in the first area 260, and an optical thickness that is an odd multiple of $\lambda/4$ in the second area 262. That is, the first structure 280 satisfies a condition $|n_1(d_{11}-d_{12})|=\lambda/4\times(2M-1)$ (where M is an integer).

For example, when $d_{11}=(\lambda/n_1)\times(1/2)$ and $d_{12}=(\lambda/n_1)\times(7/4)$, $|n_1(d_{11}-d_{12})|=|1/2-7/4|=5/4$. In this case, M=3, and the above condition is satisfied.

Consequently, a combination of the front mirror 216 and the stepped structure 270 provides different reflectances in different areas with respect to light emitted at a wavelength $\lambda$ from the active layer 214. For example, the reflectance in the first area 260 can be made higher than the reflectance in the second area 262. Thus, the surface emitting laser 200 realizes a single transverse-mode oscillation in which oscillations in higher-order transverse modes are suppressed and only an oscillation in the fundamental transverse mode occurs.

The amplitude of transmission coefficient of the combination of the front mirror 216 and the stepped structure 270 with respect to the light at wavelength $\lambda$ from the active layer 214 is higher, for example, threefold, in the second area 262 than in the first area 260.

Since the stepped structure 270 has different optical thicknesses in different planar areas, there is a phase difference between the transmission coefficient in the first area 260 and the transmission coefficient in the second area 262.

Here, a plane 244 parallel to the base substrate 210 is defined above the stepped structure 270.

Letting the optical path lengths from the interface 242 to the plane 244 in the first area 260 and the second area 262 be $L_1$ and $L_2$, respectively, the difference between the optical path lengths $L_1$ and $L_2$ is given by $L_2-L_1=(d_{12}-d_{11})\times(n_1-n_0)=(d_{12}/n_1-d_{11}/n_1)\times(1-n_0/n_1)$.

Substituting the above values, $L_2-L_1=(7\lambda/4-\lambda/2)\times(1-1/3.3)=0.871\lambda$, and N, described below, is 1.

The phase difference of the light resulting from the above difference between the optical path lengths $L_1$ and $L_2$ is given by $|L_2-L_1-N\lambda|\cdot 2\pi/\lambda$, where N is an integer that minimizes the foregoing value.

When N=1 in the above case, $|L_2-L_1-N\lambda|\cdot 2\pi/\lambda=0.258\pi$.

A configuration obtained by minimizing the difference between the actual thicknesses $d_{11}$ and $d_{12}$ of the first structure 280 with the same reflectance distribution as in the above configuration according to the first embodiment is taken as a comparative embodiment. Specifically, in the comparative embodiment, $d_{11}=(\lambda/n_1)\times(\frac{1}{2})$ and $d_{12}=(\lambda/n_1)\times(\frac{3}{4})$.

In the comparative embodiment, $L_2-L_1=(\lambda/4)\times(1-n_0/n_1)=0.174\lambda$. In this case, the integer N that minimizes $|L_2-L_1-N\lambda|$ is 0. When N=0, $|L_2-L_1-N\lambda|\cdot 2\pi/\lambda=0.348\pi$.

That is, the phase difference produced by the stepped structure 270 is smaller in the first embodiment than in the comparative embodiment. Thus, the phase distribution in the FFP is made closer to even.

In the first embodiment, regarding the optical lengths $L_1$ and $L_2$, the integer N that minimizes $|L_2-L_1-N\lambda|$ satisfies the following condition:

$|L_2-L_1-N\lambda|<(\lambda/4)\times(1-n_0/n_1)$, or preferably, $|L_2-L_1-N\lambda|=0$.

As described above, the first embodiment of the present invention is to lower the value given by $|L_2-L_1-N\lambda|\cdot 2\pi/\lambda$. Therefore, $L_2-L_1$ may not necessarily be the smallest value among those that produce desired reflectance distributions.

The thickness of the stepped structure 270 is reduced more as the value |N| becomes smaller. Therefore, |N|=1 is preferable to |N|=2, and N=0 is more preferable.

While the above description of the first embodiment concerns a concave stepped structure in which $d_{11}<d_{12}$, a convex stepped structure in which $d_{11}>d_{12}$ may alternatively be employed.

Figure 2:
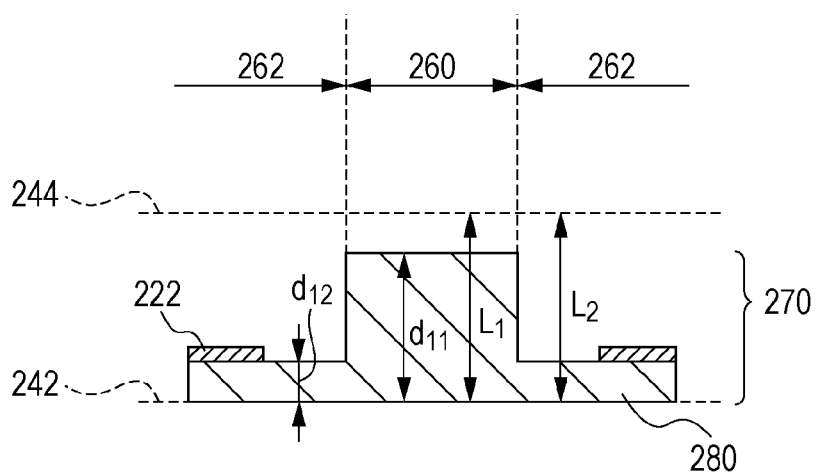
FIG. 2 is a schematic diagram of a convex stepped structure described in the first embodiment.

FIG. 2 is a sectional view of a convex stepped structure 270, with parts, such as the front mirror 216, on the rear side with respect to the interface 242 not illustrated.

In this case, for example, $d_{11}=(\lambda/n_1)\times(3/2)$ and $d_{12}=(\lambda/n_1)\times(\frac{1}{4})$. Furthermore, the reflectance provided by the combination of the front mirror 216 and the stepped structure 270 is lower in the second area 262 than in the first area 260.

In this case, $L_2-L_1=-0.871\lambda$ and N=−1. Hence, $|L_2-L_1-N\lambda|\cdot 2\pi/\lambda=0.258\pi$. That is, the phase difference produced by the stepped structure 270 is smaller than in the comparative embodiment.

Figure 3A:
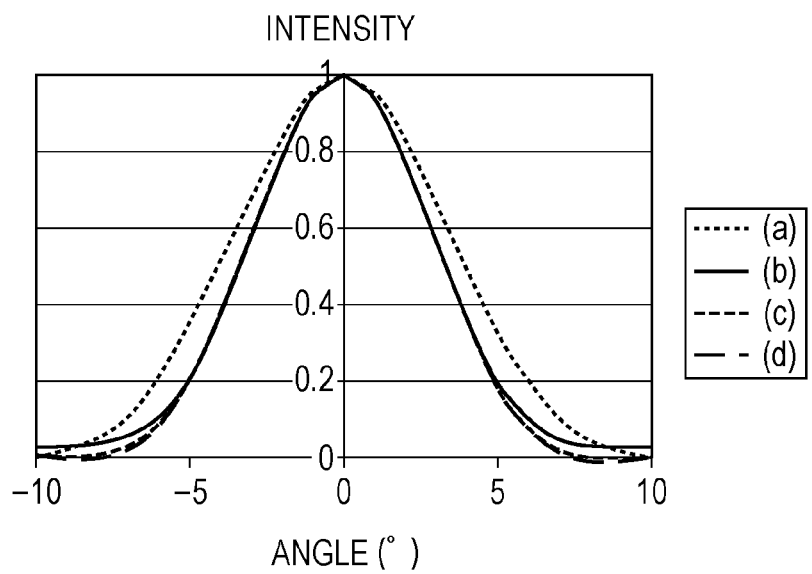
FIGS. 3A and 3B are graphs illustrating the results of exemplary calculations described in the first embodiment.
Figure 3B:
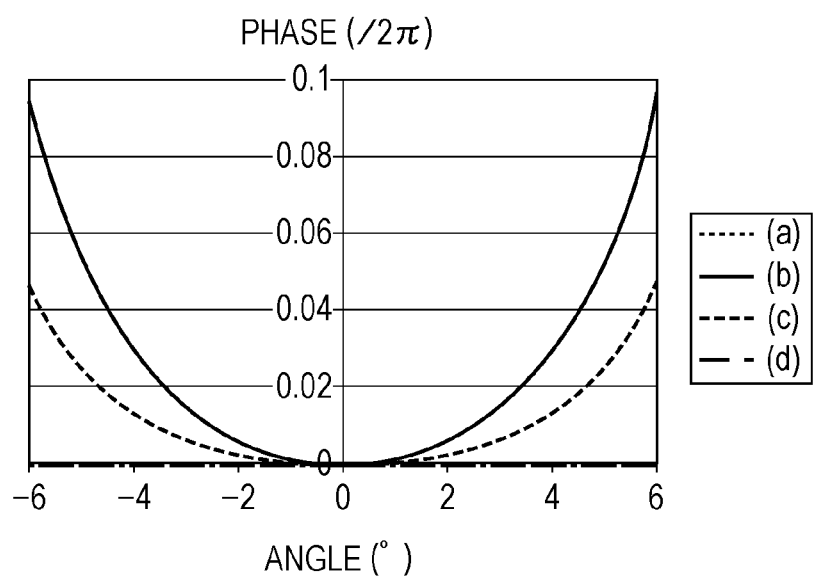

FIGS. 3A and 3B illustrate exemplary calculations representing far-field light distributions of the surface emitting laser 200 according to the first embodiment of the present invention.

FIG. 3A illustrates far-field intensity distributions normalized at 0°.

FIG. 3B illustrates distributions of far-field phase divided by $2\pi$, with values at 0° defined as 0.

Assume that the fundamental transverse mode of the surface emitting laser 200 is an LP01 mode obtained by effective refractive-index approximation with a circular core having a diameter of 5 μm and a refractive index of 3.3 and with a core-cladding relative refractive-index difference of 0.3%.

Curves (a) in FIGS. 3A and 3B represent the intensity distribution and phase distribution, respectively, in the far field in a case where no stepped structure is provided. Curves (b) to (d) in FIGS. 3A and 3B represent the intensity distributions and phase distributions in the far field in respective cases where different stepped structures 270 are provided.

The first area 260 defined in the center of the emission area is a circular area with a diameter of 4 μm, and the second area 262 surrounds the first area 260. Each stepped structure 270 is designed such that the ratio of transmission-coefficient amplitude in the first area 260 to that in the second area 262 is 1:3. Furthermore, the phase difference between the transmission coefficients in the two areas 260 and 262 is $\pi/3$ in the case (b), $\pi/6$ in the case (c), and 0 in the case (d). The calculations of far-field light distribution are each based on an approximation according to scalar diffraction theory.

Referring to FIG. 3B, while the phase varies greatly with the angle in the case (b), the phase variation is suppressed in the cases (c) and (d). That is, as the phase difference between the two transmission coefficients becomes closer to zero, the phase variation in the far field at angles around zero degrees is suppressed more, whereby the wavefront aberration in the far field is suppressed.

Second Embodiment

Figure 4:
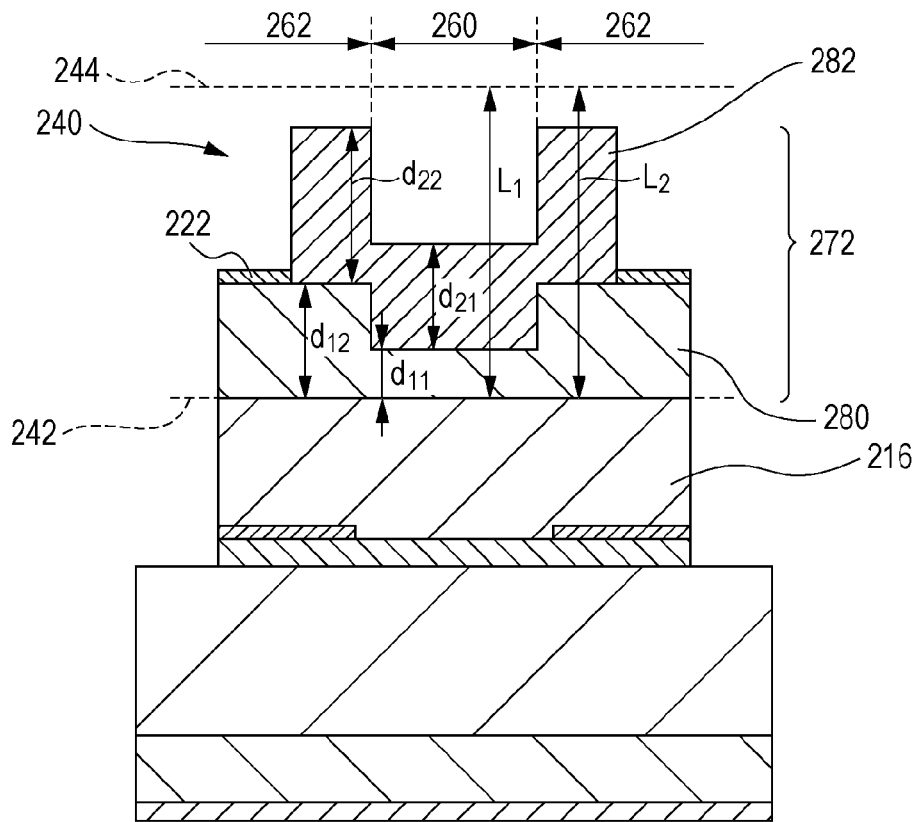
FIG. 4 is a schematic diagram of a surface emitting laser described in a second embodiment of the present invention.

FIG. 4 is a schematic sectional view of a surface emitting laser according to a second embodiment of the present invention.

The surface emitting laser according to the second embodiment is similar to the surface emitting laser 200 according to the first embodiment in that the front mirror 216 carries a stepped structure 272 thereon.

The stepped structure 272 included in the surface emitting laser according to the second embodiment includes the first structure 280 and a second structure 282.

With the stepped structure 272 including a plurality of structures, the phase difference between the two transmission coefficients provided by the combination of the front mirror 216 and the stepped structure 272 having a reflectance distribution is suppressed more than otherwise.

The first structure 280 is made of a first material having a refractive index $n_1$. The second structure 282 is made of a second material having a refractive index $n_2$, which is smaller than $n_1$.

The front electrode 222 overlies, for example, the first structure 280.

The first material is, for example, AlGaAs and has a refractive index $n_1$ of 3.3.

The second material is, for example, $SiO_2$ and has a refractive index $n_2$ of 1.5.

As illustrated in FIG. 4, the first structure 280 has an actual thickness $d_{11}$ in the first area 260 and an actual thickness $d_{12}$ in the second area 262.

Furthermore, as illustrated in FIG. 4, the second structure 282 has an actual thickness $d_{21}$ in the first area 260 and an actual thickness $d_{22}$ in the second area 262.

In this case, $d_{11}<d_{12}$ and $d_{21}<d_{22}$ as illustrated in FIG. 4. The first structure 280 has an optical thickness that is an even multiple of $\lambda/4$ in the first area 260 and an optical thickness that is an odd multiple of $\lambda/4$ in the second area 262.

For example, $d_{11}=(\lambda/n_1)\times(\frac{1}{2})$ and $d_{12}=(\lambda/n_1)\times(\frac{3}{4})$.

Thus, the interface between the first structure 280 and the second structure 282 is defined at respectively different positions in the first area 260 and the second area 262, and the reflectance provided by the combination of the front mirror 216 and the stepped structure 272 is lower in the second area 262 than in the first area 260.

Next, the actual thickness of the second structure 282 is set such that the phase difference between the two transmission coefficients provided by the stepped structure 272 becomes close to zero (an integral multiple of $2\pi$.

Preferably, the actual thickness of the second structure 282 is set such that the phase difference between the two transmission coefficients provided by the stepped structure 272 becomes zero (an integral multiple of $2\pi$.

As in the first embodiment, let the optical path lengths from the interface 242 to the plane 244 in the first area 260 and the second area 262 be $L_1$ and $L_2$, respectively.

The phase difference produced by the stepped structure 272 is given by $|L_2-L_1-N\lambda|\cdot 2\pi/\lambda$, where N is an integer that minimizes the foregoing value.

The value of $L_2-L_1$ is given as follows:

$$L_2-L_1=(d_{12}-d_{11})(n_1-n_0)+(d_{22}-d_{21})(n_2-n_0)=(d_{12}/n_1-d_{11}/n_1)(1-n_0/n_1)+(d_{22}/n_2-d_{21}/n_2)(1-n_0/n_2).$$

If the optical thickness of the second structure 282 is an even multiple of $\lambda/4$, the second structure 282 does not affect the reflectance provided by the combination of the front mirror 216 and the stepped structure 272.

For example, when $d_{21}=(\lambda/n_2)-(1/2)$ and $d_{22}=(\lambda/n_2)\times 3$, $L_2-L_1=1.01\lambda$. In this case, N=1. Hence, $|L_2-L_1-N\lambda|=0.01\lambda$. Consequently, the phase difference $|L_2-L_1-N\lambda|\cdot 2\pi/\lambda=0.02\pi$.

The high reflectance in the first area 260 changes little even if the optical thickness of the second structure 282 is not an even multiple of $\lambda/4$. For example, when $d_{21}=(\lambda/n_2)\times 0.52$ and $d_{22}=(\lambda/n_2)\times 3$, $L_2-L_1=\lambda$. In this case, N=1. Hence, the phase difference $|L_2-L_1-N\lambda|\cdot 2\pi/\lambda=0$.

Figure 5:
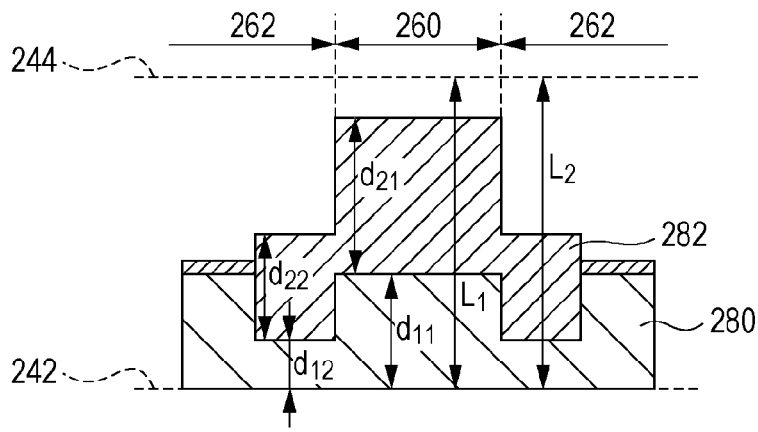
FIG. 5 is a schematic diagram of another surface emitting laser described in the second embodiment.

The above description of the second embodiment concerns the stepped structure 272 including the concave first structure 280 and the concave second structure 282 with actual thicknesses given by $d_{11}<d_{12}$ and $d_{21}<d_{22}$. Alternatively, as illustrated in FIG. 5, the stepped structure 272 may include a convex first structure 280 and a convex second structure 282 with actual thicknesses given by $d_{11}>d_{12}$ and $d_{21}>d_{22}$.

For example, in a case where $n_0=1$, $n_1=3.3$, and $n_2=1.5$, assume that $d_{11}=(\lambda/n_1)\times(1/2)$, $d_{12}=(\lambda/n_1)\times(1/4)$, $d_{21}=(\lambda/n_2)\times 3$, and $d_{22}=(\lambda/n_2)\times(1/2)$.

Then, $L_2-L_1=-1.01\lambda$. In this case, N=−1, and the phase difference produced by the stepped structure 272 is $0.02\pi$. Alternatively, assume that $d_{21}=(\lambda/n_2)\times 2.98$ and $d_{22}=(\lambda/n_2)\times(1/2)$.

Then, $L_2-L_1=-2$. In this case, N=−1, and the phase difference produced by the stepped structure 272 is 0.

Figure 6:
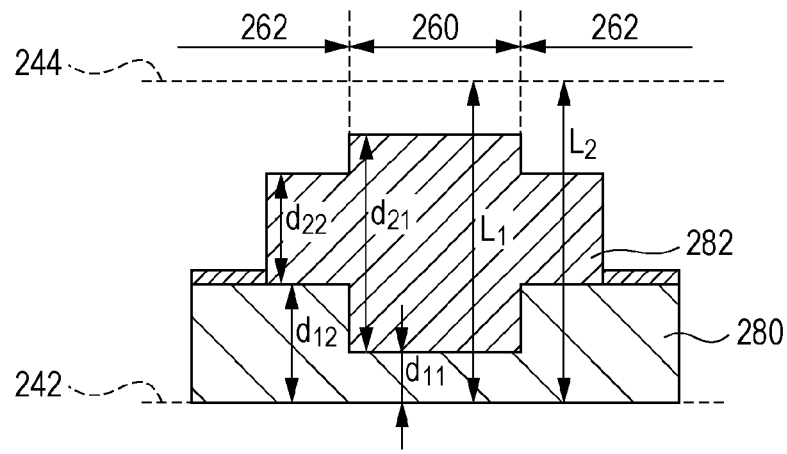
FIG. 6 is a schematic diagram of yet another surface emitting laser described in the second embodiment.

Alternatively, as illustrated in FIG. 6, a configuration in which $d_{11}<d_{12}$ and $d_{21}>d_{22}$ may be employed. That is, the stepped structure 272 may include a concave first structure 280 and a convex second structure 282.

For example, in a case where $n_0=1$, $n_1=3.3$, and $n_2=1.5$, assume that $d_{11}=(\lambda/n_1)\times(1/2)$, $d_{12}=(\lambda/n_1)\times(3/4)$, $d_{21}=(\lambda/n_2)$ and $d_{22}=(\lambda/n_2)\times(1/2)$.

Then, $L_2-L_1=0.01\lambda$. In this case, N=0, and the phase difference produced by the stepped structure 272 is $0.02\pi$. Alternatively, assume that $d_{21}=(\lambda/n_2)\times 1.02$ and $d_{22}=(\lambda/n_2)\times(1/2)$.

Figure 7:
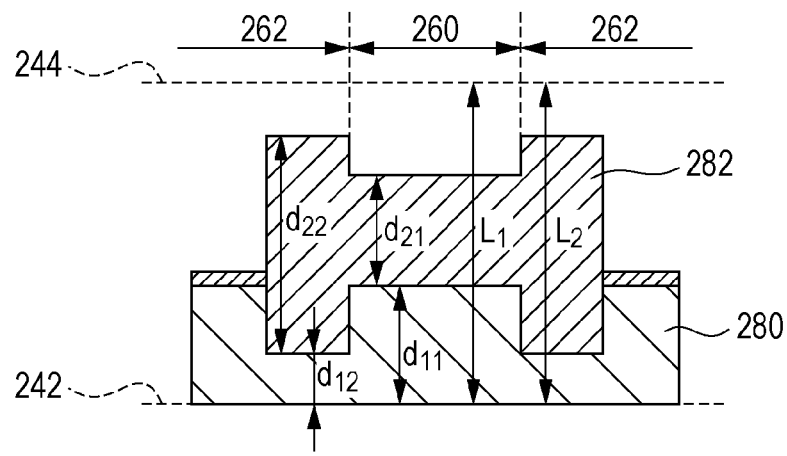
FIG. 7 is a schematic diagram of yet another surface emitting laser described in the second embodiment.

Then, $L_2-L_1=0$. In this case, N=0, and the phase difference produced by the stepped structure 272 is 0. Alternatively, as illustrated in FIG. 7, a configuration in which $d_{11}>d_{12}$ and $d_{21}<d_{22}$ may be employed. That is, the stepped structure 272 may include a convex first structure 280 and a concave second structure 282.

For example, in a case where $n_0=1$, $n_1=3.3$, and $n_2=1.5$, assume that $d_{11}=(\lambda/n_1)\times(1/2)$, $d_{12}=(\lambda/n_1)\times(1/4)$, $d_{21}=(\lambda/n_2)\times(1/2)$, and $d_{22}=(\lambda/n_2)$.

Then, $L_2-L_1=-0.01\lambda$. In this case, N=0, and the phase difference produced by the stepped structure 272 is $0.02\pi$. Alternatively, assume that $d_{21}=(\lambda/n_2)\times 0.48$ and $d_{22}=(\lambda/n_2)$.

Then, $L_2-L_1=0$. In this case, N=0, and the phase difference produced by the stepped structure 272 is 0.

In the configurations illustrated in FIGS. 6 and 7 in which $(d_{11}-d_{12})\times(d_{21}-d_{22})<0$, N=0. Therefore, the thickness of the stepped structure 272 is reduced more than in the case where $(d_{11}-d_{12})\times(d_{21}-d_{22})>0$. This provides benefits such as improved fabrication accuracy and reduced scattering in the stepped structure 272 at the boundary between the first area 260 and the second area 262.

Note that all of $d_{11}$, $d_{12}$, $d_{21}$, and $d_{22}$ may not necessarily be positive values, and one or two of them may be zero, unless departing from the scope of the present invention.

Third Embodiment

Figure 8:
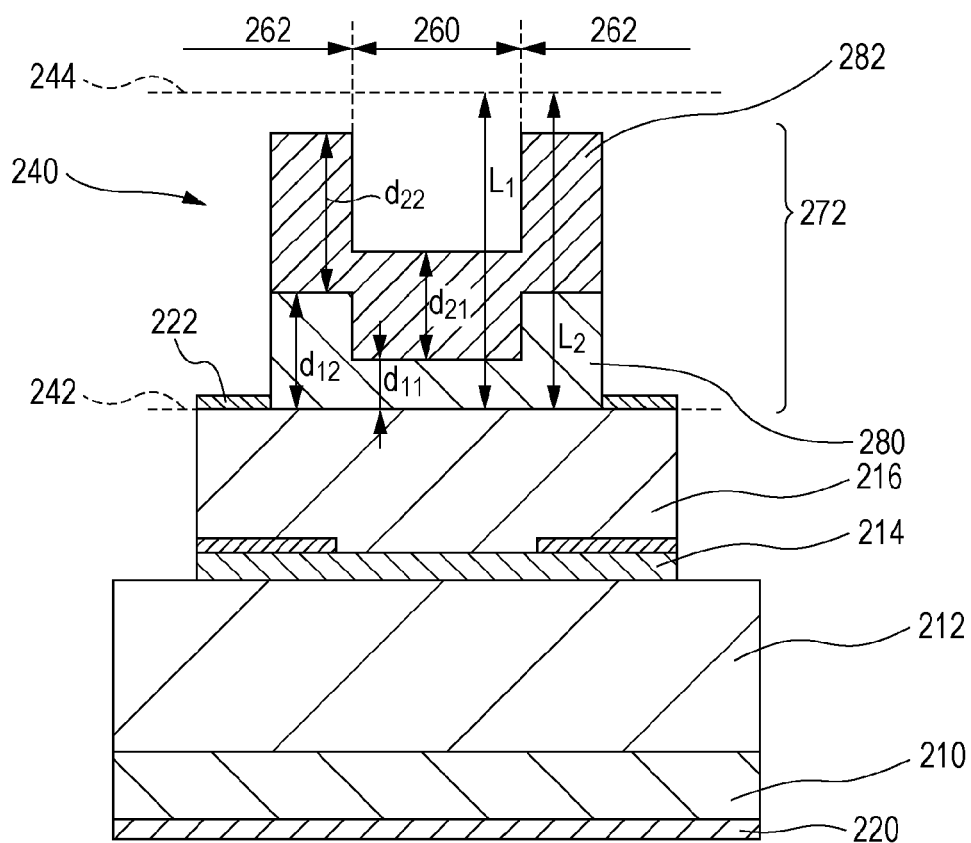
FIG. 8 is a schematic diagram of a surface emitting laser described in a third embodiment of the present invention.

FIG. 8 is a schematic sectional view of a surface emitting laser according to a third embodiment of the present invention.

The stepped structure 272 of the surface emitting laser according to the third embodiment includes, as in the second embodiment, the first structure 280 and the second structure 282.

The surface emitting laser according to the third embodiment differs from the surface emitting laser according to the second embodiment in that the first structure 280 is made of a first material having a refractive index $n_1$ but the second structure 282 is made of a second material having a refractive index $n_2$, which is larger than $n_1$.

The first material is, for example, $SiO_2$ and has a refractive index $n_1$ of 1.5.

The second material is, for example, SiN and has a refractive index $n_2$ of 2.0.

The front electrode 222 overlies, for example, the front mirror 216.

Since $n_1 < n_2$ and $n_2 > n_0$, if $d_{11}$ is set to an odd multiple of $\lambda/4$ and $d_{21}$ is set to an odd multiple of $\lambda/4$, the reflectance provided by the combination of the front mirror 216 and the stepped structure 272 in the first area 260 is increased.

Furthermore, if $d_{12}$ is set to an even multiple of $\lambda/4$ and $d_{22}$ is set to an odd multiple of $\lambda/4$, the reflectance provided by the combination of the front mirror 216 and the stepped structure 272 in the second area 262 is reduced.

In the stepped structure 272, $d_{11}$ may be either smaller or larger than $d_{12}$, and $d_{21}$ may be either smaller or larger than $d_{22}$. As a matter of convenience, assuming that $d_{12}=0$ and a configuration in which $d_{11}=d_{21}=d_{22}=\lambda/4$ is taken as a comparative embodiment, $L_2-L_1=-0.083\lambda$. In this case, N=0, and the phase difference produced by the stepped structure 272 is $0.166\pi$.

Meanwhile, if, for example, $d_{11}=0.75$, $d_{21}=1.75$, and $d_{22}=0.25$ in the third embodiment, $L_2-L_1=-2$. In this case, $N=-1$, and the phase difference produced by the stepped structure 272 is 0.

Alternatively, if $d_{11}=0.75$, $d_{21}=0.25$, and $d_{22}=0.75$, $L_2-L_1=0$. In this case, N=0, and the phase difference produced by the stepped structure 272 is 0.

Manufacturing Method

An exemplary method of manufacturing the surface emitting laser according to any of the above embodiments will now be described.

The base substrate 210 is, for example, an n-GaAs substrate.

A rear mirror 212, an active layer 214, and a front mirror 216 are formed on the base substrate 210 by, for example, metal-organic chemical vapor deposition (MOCVD).

The rear mirror 212 is a multilayer mirror including 70 pairs of n-$Al_{0.5}Ga_{0.5}As$ and n-$Al_{0.9}Ga_{0.1}As$ films that each have an optical thickness of $\lambda/4$. The active layer 214 is a multiple-quantum-well structure made of GaInP and AlGaInP films. When a current is supplied to the active layer 214, the active layer 214 produces an optical gain in the form of laser oscillation at a wavelength $\lambda$ of 680 nm.

The front mirror 216 includes 35 pairs of p-$Al_{0.5}Ga_{0.5}As$ and p-$Al_{0.9}Ga_{0.1}As$ films that each have an optical thickness of $\lambda/4$.

Part of the front mirror 216 forms an oxidizable layer made of $Al_{0.98}Ga_{0.02}As$ and having an actual thickness of 30 nm.

If a first structure 280 made of semiconductor is employed in the stepped structure 272, the first structure 280 may be formed subsequently to the front mirror 216.

Subsequently, the active layer 214 and the front mirror 216 are etched, for example, dry-etched, into a cylindrical mesa structure having a diameter of, for example, 30 μm.

If the first structure 280 has already been formed, the first structure 280 is also etched.

The oxidizable layer is then oxidized from the sidewall of the mesa structure. The oxidization is performed, for example, for 30 minutes in a water-vapor atmosphere heated to 450° C. Thus, the oxidizable layer is formed into a current confinement structure 218 including an oxidized region and a non-oxidized region.

The non-oxidized region has a circular shape having a diameter of 5 μm with the center thereof coinciding with the center of the mesa structure.

Subsequently, the sidewall of the mesa structure is covered with an insulating film or the like.

A rear electrode 220 made of AuGe and Au films is formed on the backside of the base substrate 210. Furthermore, a front electrode 222 made of Ti, Pt, and Au films is formed on the front mirror 216 or the first structure 280.

In the above process of manufacturing the surface emitting laser, the stepped structure 272 is formed in any step after the formation of the front mirror 216 or the first structure 280.

For example, the stepped structure 272 is formed after the formation of the current confinement structure 218.

The stepped structure 272 may be formed by etching or the like.

A method of forming a stepped structure 272 in which $(d_{11}-d_{12}) \times (d_{21}-d_{22}) > 0$ as illustrated in FIG. 4 or 5, specifically, the stepped structure 272 illustrated in FIG. 5, will now be described with reference to FIGS. 9A to 9D.

Referring to FIG. 9A, a first layer 300 is formed on the front mirror 216, and a second layer 302 is formed on the first layer 300.

The first layer 300 is, for example, a semiconductor layer made of AlGaAs. Alternatively, the first layer 300 may be, for example, a dielectric layer made of $SiO_2$.

The second layer 302 is, for example, a dielectric layer made of SiN.

The first layer 300 and the second layer 302 are formed by MOCVD, plasma chemical vapor deposition (CVD), sputtering, or the like.

A resist 320 is provided on the second layer 302, and part of the resist 320 in the second area 262 is photolithographically removed, whereby a pattern is formed.

Subsequently, referring to FIG. 9B, the second layer 302 and the first layer 300 are etched with the resulting resist 320 used as a mask.

The etching is performed with, for example, a wet etchant such as phosphoric acid or buffered hydrofluoric acid.

Subsequently, referring to FIG. 9C, the resist 320 is removed with an organic solvent or the like.

Subsequently, referring to FIG. 9D, a third layer 304 is formed on the first layer 300 and the second layer 302 by plasma CVD, sputtering, or the like.

The third layer 304 is made of a material having a refractive index that is close to or the same as the refractive index of the second layer 302.

Thus, the first structure 280 made of the first layer 300 and the second structure 282 made of the second layer 302 and the third layer 304 are provided.

If part of the resist 320 in the first area 260 is removed in the above process, the stepped structure 272 illustrated in FIG. 4 is provided.

A method of forming a stepped structure 272 in which $(d_{11}-d_{12}) \times (d_{21}-d_{22}) < 0$ as illustrated in FIG. 6 or 7, specifically, the stepped structure 272 illustrated in FIG. 7, will now be described with reference to FIGS. 10A to 10E.

Figure 10A:
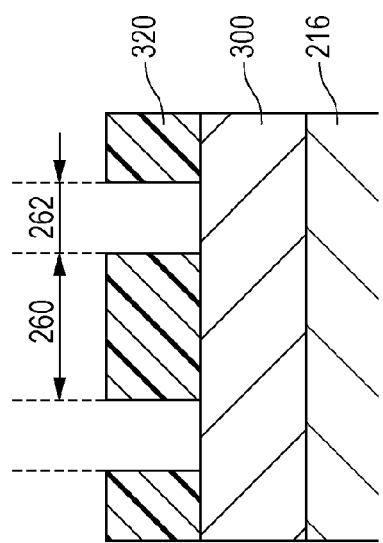
FIGS. 10A to 10E illustrate another method of manufacturing a surface emitting laser described in the third embodiment.

Referring to FIG. 10A, a first layer 300 is formed on the front mirror 216. The first layer 300 is semiconductor or dielectric and is formed by MOCVD, plasma CVD, sputtering, or the like.

A resist 320 is provided on the first layer 300 and part of the resist 320 in the second area 262 is photolithographically removed, whereby a pattern is formed. In this step, the resist pattern may be formed such that islands thereof each have, in sectional view, an inverse tapered shape whose area decreases from the top toward the bottom.

Figure 10B:
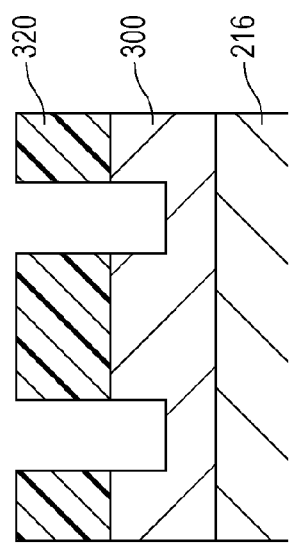

Subsequently, referring to FIG. 10B, the first layer 300 is etched with the resulting resist 320 used as a mask. The etching is performed with, for example, a wet etchant such as phosphoric acid or buffered hydrofluoric acid.

Figure 10C:
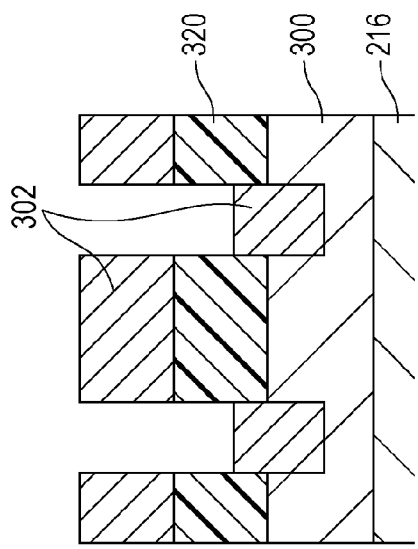

Subsequently, referring to FIG. 10C, a second layer 302 is formed on the first layer 300 and the resist 320 by sputtering or the like.

Figure 10D:
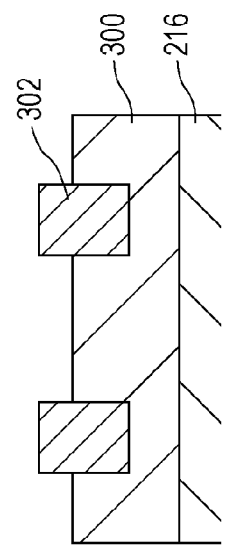

Subsequently, referring to FIG. 10D, the resist 320 is removed with an organic solvent or the like. In this step, the second layer 302 having been formed on the resist 320 is also removed.

Figure 10E:
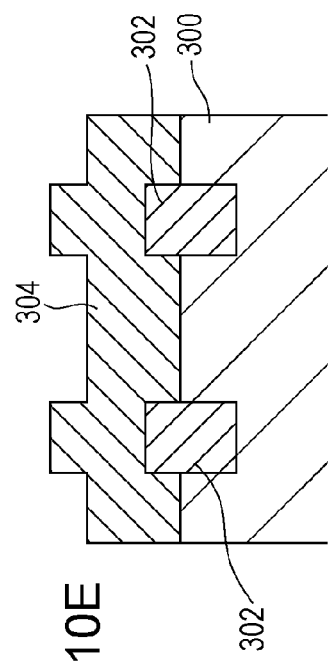

Subsequently, referring to FIG. 10E, a third layer 304 is formed over the first layer 300 and the second layer 302 by plasma CVD, sputtering, or the like.

The third layer 304 is made of a material having a refractive index that is close to or the same as the refractive index of the second layer 302.

Thus, the first structure 280 made of the first layer 300 and the second structure 282 made of the second layer 302 and the third layer 304 are provided.

If part of the resist 320 in the first area 260 is removed in the above process, the stepped structure 272 illustrated in FIG. 6 is provided.

Fourth Embodiment

An electrophotographic image forming apparatus will now be described as an exemplary application of the surface emitting laser according to any of the first to third embodiments. The image forming apparatus includes a light source in the form of an array of surface emitting lasers, and a scanning device.

Figure 11A:
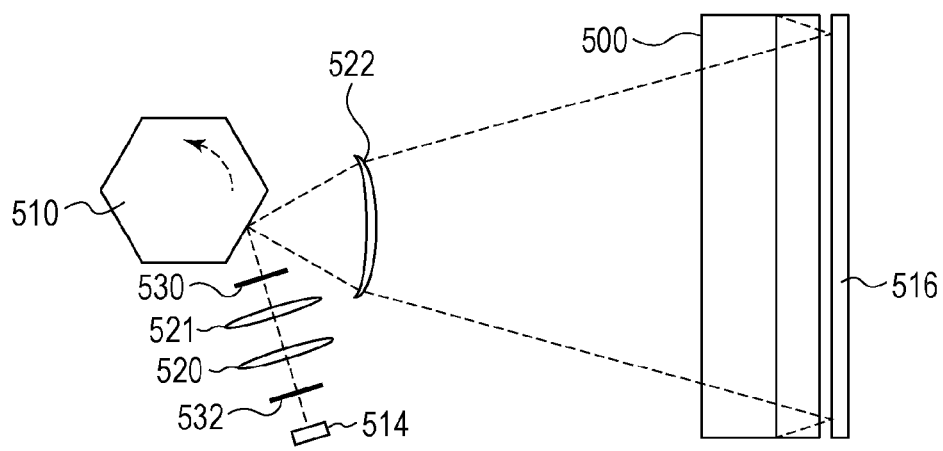
FIGS. 11A and 11B illustrate an exemplary application of the surface emitting laser described in any of the embodiments to an exposure light source of an image forming apparatus.
Figure 11B:
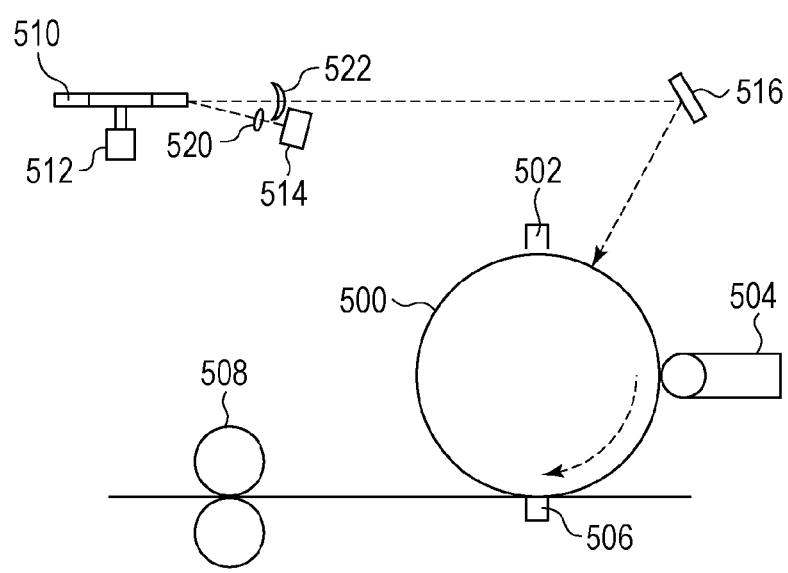

FIGS. 11A and 11B illustrate an image forming apparatus or the like that includes a surface-emitting-laser-array light source 514 in which a plurality of surface emitting lasers according to any of the above embodiments are provided.

FIG. 11A is a plan view of the image forming apparatus. FIG. 11B is a side view of the image forming apparatus.

A laser beam emitted from the surface-emitting-laser-array light source 514, as a recording light source, is transmitted through a collimator lens 520 and travels toward a rotating polygon mirror 510, which is driven to rotate by a motor 512.

A main-scan aperture stop 530 is provided on the optical axis between the collimator lens 520 and the rotating polygon mirror 510. A sub-scan aperture stop 532 is provided between the surface-emitting-laser-array light source 514 and a cylindrical lens 521.

The surface-emitting-laser-array light source 514 causes linear polarization. The direction of linear polarization is, for example, parallel to a main scanning direction.

The laser beam that has struck the rotating polygon mirror 510 is reflected by the rotating polygon mirror 510 that is rotating, thereby being deflected at a continuously changing angle. The deflected beam is transmitted through an f-θ lens 522, where distortion and the like of the beam are compensated. The beam is subsequently reflected by the mirror 516 in such a manner as to fall onto a photosensitive member 500.

The photosensitive member 500 is charged in advance by a charging device 502 and is exposed to the scanningly moved laser beam, whereby an electrostatic latent image is formed thereon. The electrostatic latent image formed on the photosensitive member 500 is developed by a developing device 504 into a visible image. The visible image is transferred to transfer paper by a transfer charging device 506. The transfer paper having the visible image transferred thereto is conveyed to a fixing device 508, where fixing is performed thereon. Subsequently, the paper having the fixed image is discharged to the outside of the apparatus.

The surface-emitting-laser-array light source 514 is also applicable to any other optical or medical equipment.

Other Embodiments

The present invention is not limited to the above embodiments, and various changes and modifications can be made thereto. For example, if the difference in refractive index between the first material for the first structure 280 and the environmental medium 240 or the second material is large, the first structure 280 may be made of a plurality of materials having respective refractive indices that are close to one another. Moreover, if the difference in refractive index between the second material for the second structure 282 and the environmental medium 240 or the first material is large, the second structure 282 may be made of a plurality of materials having respective refractive indices that are close to one another.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-276170 filed Dec. 10, 2010, which is hereby incorporated by reference herein in its entirety.

What is claimed is:

1. A surface emitting laser, comprising:
a substrate;
a rear mirror on the substrate;
an active layer on the rear mirror;
a front mirror on the active layer; and
a stepped structure on the front mirror,
wherein the stepped structure includes a first portion in a first area defined in a central part of an emission area and a second portion in a second area defined on an outer side of the first area within the emission area,
wherein the first portion and the second portion have different thicknesses,
wherein the stepped structure includes a first structure comprising a first material having a refractive index $n_1$ that is larger than a refractive index $n_0$ of an environmental medium,
wherein, when thicknesses of the first structure in the first area and in the second area are $d_{11}$ and $d_{12}$, respectively, the following holds:

$$|n_1(d_{11}-d_{12})|=\lambda/4\times(2M-1)$$

where M is an integer and $\lambda$ is an oscillation wavelength of the surface emitting laser, and
wherein, in terms of an optical path length from a plane, that is defined above the stepped structure and is extending parallel to the substrate, to an interface between the front mirror and the stepped structure, an optical path length $L_1$ in the first area and an optical path length $L_2$ in the second area satisfy the following expression with respect to an integer N that minimizes $|L_2-L_1-N\lambda|$:

$$|L_2-L_1-N\lambda|<(\lambda/4)\times(1-n_0/n_1).$$

2. The surface emitting laser according to claim 1, wherein the stepped structure further includes a second structure comprising a second material having a refractive index n2 that is larger than the refractive index n0 and different from the refractive index n1, and
wherein the second structure is provided on the first structure.

3. A surface emitting laser array comprising:
a plurality of surface emitting lasers,
wherein at least one of the surface emitting lasers is the surface emitting laser according to claim 1.

4. The surface emitting laser according to claim 1, wherein $d_{11}<d_{12}$.

5. The surface emitting laser according to claim 1, wherein $d_{11} > d_{12}$.

6. The surface emitting laser according to claim 1, wherein $|L_2 - L_1 - N\lambda| = 0$.

7. The surface emitting laser according to claim 2, wherein the second structure has a thickness d21 in the first area and a thickness d22 in the second area, the thickness d22 being different from the thicknesses d21.

8. The surface emitting laser according to claim 2, wherein d21<d22.

9. The surface emitting laser according to claim 2, wherein $d_{21} > d_{22}$.

10. The surface emitting laser according to claim 2, wherein $n_2 < n_1$.

11. The surface emitting laser according to claim 2, wherein $n_2 > n_1$.

12. The surface emitting laser according to claim 5, wherein (d11−d12)×(d21−d22)>0 and |N|=1.

13. The surface emitting laser according to claim 7, wherein (d11−d12)×(d21−d22)<0 and N=0.

14. An image forming apparatus comprising:
   the surface emitting laser array according to claim 3;
   a photosensitive member configured to form an electrostatic latent image by receiving light from the surface-emitting-laser array;
   a charging device configured to charge the photosensitive member; and
   a developing device configured to develop the electrostatic latent image.

* * * * *